United States Patent

Doi et al.

[11] Patent Number: 5,880,032
[45] Date of Patent: Mar. 9, 1999

[54] METHOD AND APPARATUS FOR MANUFACTURING A SEMICONDUCTOR DEVICE

[75] Inventors: Kenji Doi, Kawasaki; Ichiro Katakabe; Naoto Miyashita, both of Yokohama, all of Japan

[73] Assignee: Kabushiki Kaisha Toshiba, Kawasaki, Japan

[21] Appl. No.: 689,111

[22] Filed: Jul. 30, 1996

[30] Foreign Application Priority Data

Jul. 31, 1995 [JP] Japan ................................. 7-194698

[51] Int. Cl.[6] .................................................. H01L 21/00
[52] U.S. Cl. ........................ 438/706; 438/714; 438/718; 438/906; 216/62; 216/67; 216/79; 134/1.2; 134/1.3; 134/21; 134/31
[58] Field of Search ................................ 216/62, 67, 79; 438/706, 714, 718, 906; 134/1.2, 1.3, 21, 31

[56] References Cited

U.S. PATENT DOCUMENTS

| | | | |
|---|---|---|---|
| 4,857,142 | 8/1989 | Syverson | 156/646 |
| 5,167,761 | 12/1992 | Westendorp et al. | 156/646 |
| 5,169,408 | 12/1992 | Biggerstaff et al. | 29/25.01 |
| 5,173,152 | 12/1992 | Tanaka | 156/646 |
| 5,500,081 | 3/1996 | Bergman | 156/646.1 |
| 5,567,332 | 10/1996 | Mehta | 216/57 |
| 5,620,559 | 4/1997 | Kikuchi | 438/723 |

*Primary Examiner*—Nam Nguyen
*Assistant Examiner*—Steven H. VerSteeg
*Attorney, Agent, or Firm*—Finnegan, Henderson, Farabow, Garrett & Dunner, L.L.P.

[57] ABSTRACT

A method of manufacturing a semiconductor device comprises the steps of introducing a first gas containing steam or alcohol into a processing vessel housing a semiconductor substrate, and introducing a hydrogen fluoride gas as a second gas into the processing vessel after stopping introduction of the first gas into the process chamber.

15 Claims, 4 Drawing Sheets

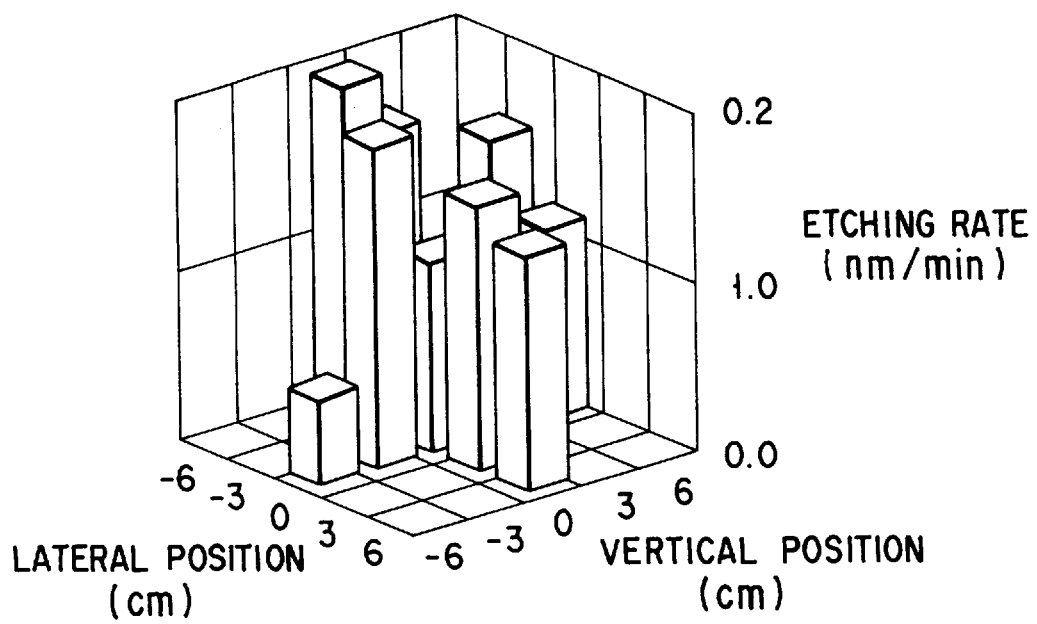
F I G. 7

METHOD AND APPARATUS FOR MANUFACTURING A SEMICONDUCTOR DEVICE

BACKGROUND OF THE INVENTION

1. Field of the Invention

The present invention relates to a method and an apparatus for manufacturing a semiconductor device, particularly, to the removal of a natural oxide film from a semiconductor substrate in the manufacture of a semiconductor device.

2. Description of the Related Art

A dry etching method using a HF (hydrogen fluoride) gas is known to the art as a technique for etching silicon substrates one by one for removing an oxide film from the substrate surface. In the conventional dry etching method, it was customary to prepare an etchant by adding steam or a nitrogen gas containing steam to anhydrous HF so as to improve the etching rate. In addition, use of the mixed gas is effective for the saving of HF which is costly. In using the mixed gas in the dry etching method, steam alone or a mixture of steam and a nitrogen gas is introduced into a processing vessel, followed by introducing a mixed gas containing an anhydrous HF gas and a nitrogen gas into the processing vessel. In short, the etching treatment using the anhydrous HF was performed in the presence of a large amount of steam.

The etching method outlined above permits a high etching rate. In addition, the natural oxide film formed on a silicon substrate is very thin. It follows that it is difficult to control the etching rate to etch selectively the natural oxide film alone, leading to the problem that oxide films other than the natural oxide film tend to be etched together with the natural oxide film. Further, the etching rate in a peripheral region is higher than that in a central portion, when it comes to a single wafer. In other words, the conventional dry etching method is not satisfactory in uniformity of etching rate over the entire surface of a single wafer. What should also be noted is that, since the etchant used contains a large amount of steam as pointed out previously, water is left even after the etching treatment, leading to growth of a new natural oxide film.

SUMMARY OF THE INVENTION

An object of the present invention is to provide a method of manufacturing a semiconductor device, which makes it possible to remove by etching the natural oxide film alone at a uniform etching rate over the entire surface of a semiconductor substrate.

Another object is to provide an apparatus for manufacturing a semiconductor device, which permits effectively working the above-noted manufacturing method of the semiconductor device.

According to a first aspect of the present invention, there is provided a method of manufacturing a semiconductor device, comprising the steps of:

introducing a first gas containing steam or alcohol into a processing vessel housing a semiconductor substrate; and introducing a hydrogen fluoride gas as a second gas into the process chamber after stopping introduction of the first gas into the processing vessel.

According to a second aspect of the present invention, there is provided an apparatus for manufacturing a semiconductor device, comprising:

a process chamber housing a semiconductor substrate;

a first piping for introducing a first gas containing steam or alcohol into the processing vessel;

a second piping for introducing an inert gas containing hydrogen fluoride as a second gas into the processing vessel; and means for controlling the timing for stopping introduction of the first gas and for starting introduction of the second gas into the processing vessel;

wherein a surface of that portion of the processing vessel which is made of a metal is covered with a coating layer exhibiting a high resistance to hydrogen fluoride.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 schematically shows the uniformity of etching over the entire surface of a substrate, which is achieved by the method of the present invention.

DETAILED DESCRIPTION OF THE PREFERRED EMBODIMENTS

Figure 1:
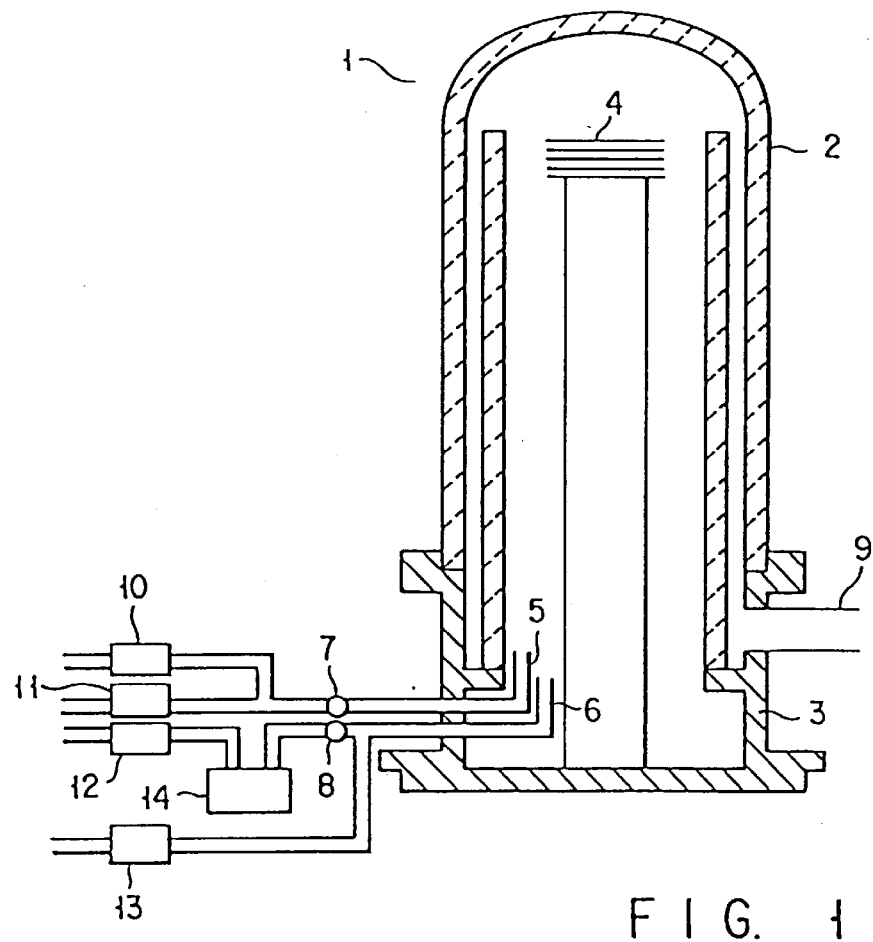
FIG. 1 schematically shows the construction of an apparatus for manufacturing a semiconductor device according to an embodiment of the present invention.

A method of manufacturing a semiconductor device according to a first aspect of the present invention comprises the step of introducing a first gas containing steam or alcohol into a processing vessel housing a semiconductor substrate, and the step of introducing a hydrogen fluoride gas as a second gas into said processing vessel after stopping introduction of the first gas into the processing vessel. In the method of the present invention, it is possible to introduce an inert gas into the processing vessel simultaneously with introduction of a hydrogen fluoride gas. Incidentally, it is desirable for the hydrogen fluoride gas used in the present invention not to contain steam or alcohol. For example, an anhydrous hydrogen fluoride gas should desirably be used as the hydrogen fluoride gas.

In the present invention, a hydrogen fluoride gas is introduced into the processing vessel after stopping introduction of a first gas containing steam or alcohol into the processing vessel. What should be noted is that, in the step of introducing the hydrogen fluoride gas, steam or alcohol, which has already been introduced in the preceding step into the processing vessel, may remain inside the processing vessel in the form of free gaseous molecules.

Alternatively, it is possible to remove steam or alcohol remaining inside the processing vessel in the form of free gaseous molecules by introducing a purge gas into the processing vessel, followed by introducing a hydrogen fluoride gas into the processing vessel. In this case, it is desirable to use a first piping for the introduction of the first gas and a second piping for the introduction of the hydrogen fluoride gas (second gas), with an inert gas kept introduced into the processing vessel through these first and second pipings. The particular system permits purging without fail the steam or alcohol remaining inside the processing vessel and also permits preventing the steam or alcohol from flowing backward into the pipings. It is also possible to use a first piping for the introduction of the first gas and a second piping for the introduction of a hydrogen fluoride gas, with an inert gas kept introduced into the processing vessel through the second piping. In this case, the flow rate of the inert gas through the second piping can be increased after the introduction of the first gas is stopped. The particular system makes it possible to suppress fluctuation of the pressure inside the processing vessel which is caused by the stopping of introduction of first gas containing steam or alcohol into the processing vessel.

The alcohol used in the present invention includes, for example, methyl alcohol, ethyl alcohol, and propyl alcohol. Also, a mixed gas containing steam or alcohol together with an inert gas such as a nitrogen gas or an argon gas can be used as a first gas containing steam or alcohol. Further, the inert gas introduced into the processing vessel together with a hydrogen fluoride gas includes, for example, a nitrogen gas and argon gas.

Where steam is contained in the first gas, the steam content of the gas should be 5 to 20% by volume. Where an alcohol is contained in the particular gas, the alcohol content of the gas should be 5 to 25% by volume.

In general, a hydrogen fluoride gas is introduced into the processing vessel in the form of a mixed gas consisting of the hydrogen fluoride gas and a nitrogen gas. The hydrogen fluoride content of the mixed gas should desirably be 5 to 10% by volume.

Further, the pressure inside the processing vessel should desirably be set at $8 \times 10^3$ Pa to $5 \times 10^4$ Pa during surface treatment of a semiconductor substrate.

In treating a surface of a semiconductor substrate by the method of the present invention using a hydrogen fluoride gas, a first gas containing steam or alcohol is introduced into the processing vessel before introduction of a second gas containing hydrogen fluoride. In other words, the first gas is introduced in advance into the processing vessel in place of allowing the hydrogen fluoride gas used as a process gas to contain steam or alcohol.

If the first gas containing steam or alcohol is introduced in advance into the processing vessel in this fashion, water or alcohol is attached to or adsorbed by the surface of a semiconductor substrate. If the second gas containing hydrogen fluoride is introduced into the processing vessel after stopping of the first gas introduction, an etching treatment is performed in the presence of water or alcohol remaining on the surface of a semiconductor substrate, with the result that a thin natural oxide film is selectively removed from the surface of the semiconductor substrate.

The etching mechanism, which has not yet been clarified sufficiently, is considered to be as follows. Specifically, water or alcohol reacts with HF to form $HF_2^- + H_3O^+$. Then, the resultant $HF_2^-$ reacts with $SiO_2$ present on the surface of the semiconductor substrate to form $SiF_4 + H_2O$, thereby etching the oxide film.

It should be noted that the etching scarcely proceeds in the absence of water. On the other hand, if a hydrogen fluoride gas containing a large amount of water is used as a process gas, the etching proceeds excessively. In this case, even a portion which should not be etched tends to be etched. Further, the etching rate is rendered nonuniform over an entire surface of a semiconductor substrate. However, where the water remaining on the surface of the semiconductor substrate is used as a main water source as in the present invention, the natural oxide film can be etched uniformly at a low etching rate.

As pointed out above, the water remaining on the surface of a semiconductor substrate is mainly used as a water source in the present invention. Since the etching scarcely proceeds in the absence of water, the etching ceases to proceed in some cases before the natural oxide film is removed completely (insufficient etching). In such a case, it suffices to repeat the treatment described above. The thickness of the oxide film removed by a single etching treatment, which is of course dependent on conditions, is about 0.4 nm. Naturally, the oxide film of a predetermined thickness formed on a substrate surface can be removed completely by repeating the treatment described above.

FIG. 1 shows an apparatus for manufacturing a semiconductor device, which is adapted for working the manufacturing method of the present invention described above. As shown in the drawing, the manufacturing apparatus comprises a processing vessel 1 consisting of a process chamber 2 and a lower flange portion 3. A silicon wafer 4 is arranged within the processing vessel 1. The lower flange portion 3 is provided with supply pipings 5, 6 and an exhaust pipe 9. A nitrogen gas ($N_2$) containing water ($H_2O$) is introduced into the process chamber 2 through the supply piping 6. On the other hand, a nitrogen gas containing HF is introduced into the process chamber 2 through the supply piping 5. The piping 5 is branched on an upstream side into two pipes. A mass flow controller 10 for controlling the flow rate of a nitrogen gas is mounted to one of these branched pipes, with a mass flow controller 11 for controlling the flow rate of HF being mounted to the other branched pipe. Valve 7 is mounted to supply piping 5. Further, a mass flow controller 12 for controlling the flow rate of a nitrogen gas is mounted to the supply piping 6. A tank 14 for storing water or alcohol and a valve 8 are arranged between the mass flow controller 12 and the processing vessel 1. The supply piping 6 is also branched in a region intermediate between the valve 8 and the processing vessel. As seen from the drawing, a mass flow controller 13 for adjusting the flow rate of a nitrogen gas ($N_2$ gas) is connected to a pipe branched from the supply piping 6.

The material used for forming the process chamber 2 includes, for example, quartz and SiC.

In general, the lower flange portion 3 is made of a metal, and the surface of the lower flange portion is covered with coating of, for example, a material subjected to a fluoride-passivation treatment, a nickel-phosphorus plating, Hastelloy C-22 layer, etc. so as to make the surface of the lower flange portion 3 resistant to hydrogen fluoride. Likewise, a treatment for improving the resistance to hydrogen fluoride should desirably be applied to that region of the apparatus which is interposed between the valves of the supply piping 5, 6 and the inner region of the processing vessel.

FIGS. 2A to 5B are graphs collectively showing how to introduce gases into the apparatus shown in FIG. 1. In each of these graphs, time is plotted on the abscissa, with the gas flow rate into the processing vessel being plotted on the ordinate. The mark $t_1$ in the graph denotes the time when introduction of a first gas, i.e., a steam-containing nitrogen gas ($N_2$ gas), into the processing vessel is stopped, with $t_2$ denoting the time when a HF gas (second gas) starts to be introduced into the processing vessel. In general, steam or alcohol remaining within the processing vessel in the form of a gas is removed from within the processing vessel five seconds or more after $t_1$.

Figure 2A:
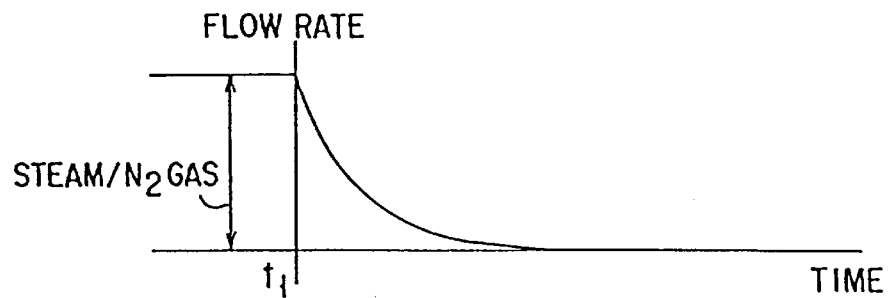
FIGS. 2A and 2B show graphs each covering the change with time in the gas flow rate into a process chamber in a method of manufacturing a semiconductor device according to the embodiment of the present invention.
Figure 2B:
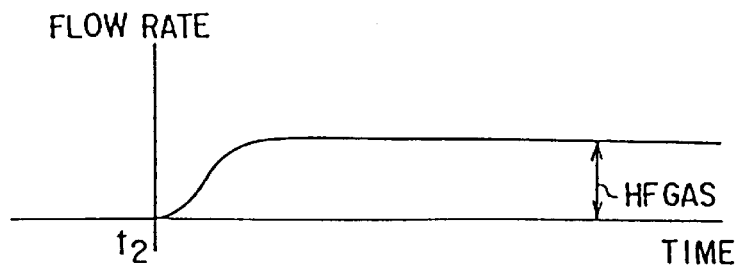

In the method shown in FIGS. 2A and 2B, a steam-containing nitrogen gas and a HF gas are introduced into the processing vessel substantially simultaneously. In this case, the etching rate is somewhat improved, though the uniformity of etching is slightly impaired. This clearly supports that, where a high importance is placed on the productivity, it is desirable to introduce a hydrogen fluoride gas into the processing vessel while steam in the form of a gas remains within the processing vessel.

Figure 3A:
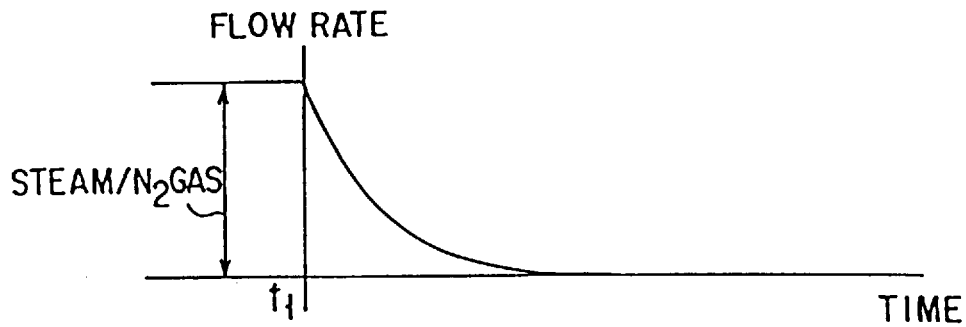
FIGS. 3A and 3B show graphs each covering the change with time in the gas flow rate into a process chamber in a method of manufacturing a semiconductor device according to the embodiment of the present invention.
Figure 3B:
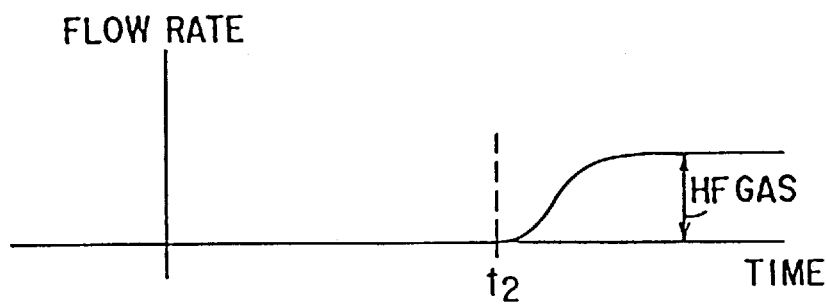
Figure 4A:
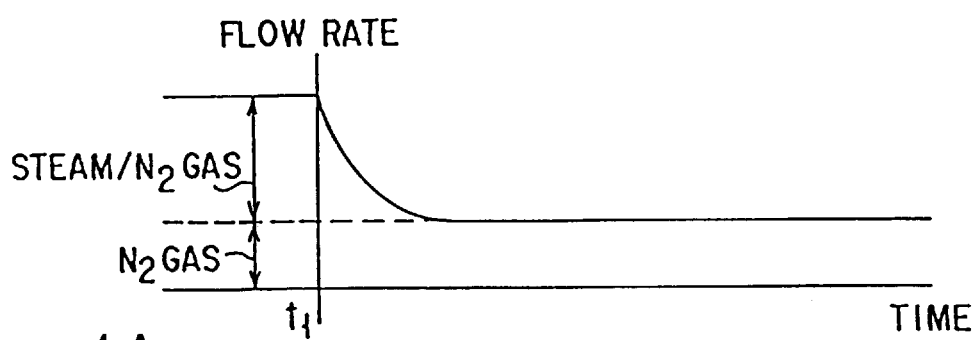
FIGS. 4A and 4B show graphs each covering the change with time in the gas flow rate into a process chamber in a method of manufacturing a semiconductor device according to the embodiment of the present invention.
Figure 4B:
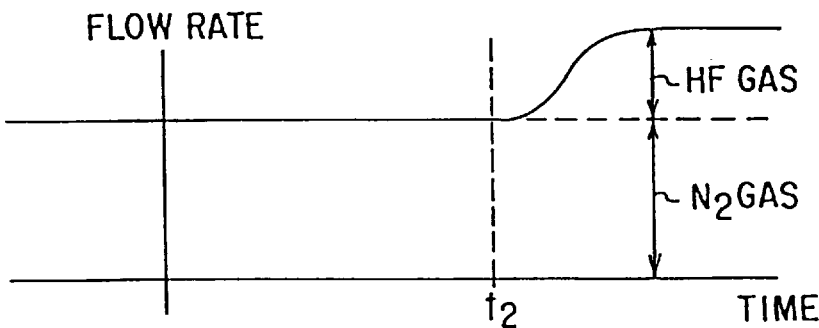

On the other hand, in the method shown in FIGS. 3A and 3B, a hydrogen fluoride gas is introduced into the processing vessel after removal of steam in the form of a gas from within the processing vessel. In this case, the water remaining on the surface of the semiconductor substrate is solely involved in the etching, leading to an improved uniformity of etching and to a slightly low etching rate.

Where a piping to which a treatment for improving the resistance to hydrogen fluoride is not applied is used in each the methods shown in FIGS. 2A, 2B, 3A, and 3B, the presence of water remaining on the piping tends to cause the piping to be corroded in the step of introducing a hydrogen fluoride gas into the processing vessel. Attentions should be paid in this connection to the method shown in FIGS. 4A and 4B, in which a nitrogen gas continues to flow during the etching treatment. Naturally, it is impossible for steam to remain within the piping and consequently making the piping free from corrosion.

Where a hydrogen fluoride gas is introduced after removal of the steam remaining within the processing vessel in the form of a gas as shown in FIGS. 2A and 2B, the inner pressure of the processing vessel is lowered immediately after stopping of the steam-containing nitrogen gas introduction into the processing vessel. The pressure fluctuation tends to cause the etching rate nonuniform over the entire surface of a single wafer or nonuniform among different wafers. In order to overcome this difficulty, the introduction of a steam-containing nitrogen gas into the processing vessel is stopped first and, then, a nitrogen gas is introduced in an amount conforming with the pressure reduction within the processing vessel in the method shown in FIGS. 5A and 5B. As a result, the pressure fluctuation can be suppressed substantially completely, leading to a satisfactory etching uniformity.

Figure 6:
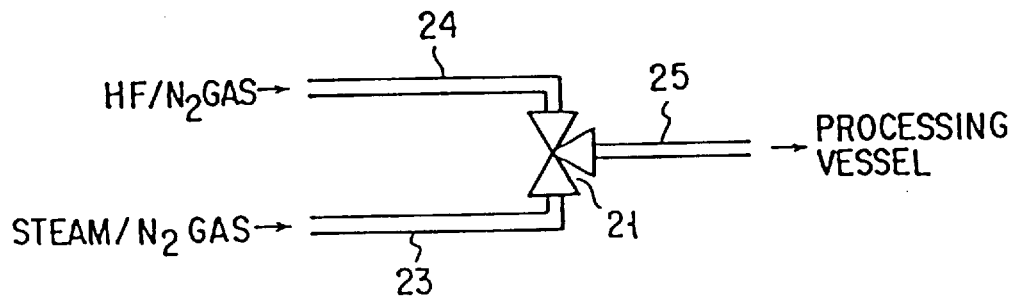
FIG. 6 shows in a magnified fashion a part of the apparatus for manufacturing a semiconductor device according to the embodiment of the present invention.

FIG. 6 shows a modification in which a steam pipe and an HF pipe are connected to each other via a switching valve.

As seen from the drawing, a pipe 23 for introducing a nitrogen gas containing steam and another pipe 24 for introducing a nitrogen gas containing a hydrogen fluoride gas are connected to a switching valve 21. Further, one end of a pipe 25 is connected to the switching valve 21, with the other end of the pipe 25 being connected to the processing vessel (not shown). In this modification, it is unavoidable for steam to be brought into contact with hydrogen fluoride in the switching step, making it desirable to apply a treatment for improving the resistance to hydrogen fluoride to the pipe 25.

The switching valve 21 makes it possible to control the timing for stopping the steam-containing nitrogen gas supply and the timing for starting the hydrogen fluoride-containing gas supply into the processing vessel. In addition, it is possible to use a single valve and a single pipe for controlling the supply of the steam-containing nitrogen gas and the hydrogen fluoride-containing nitrogen gas.

EXAMPLE 1

Figure 5A:
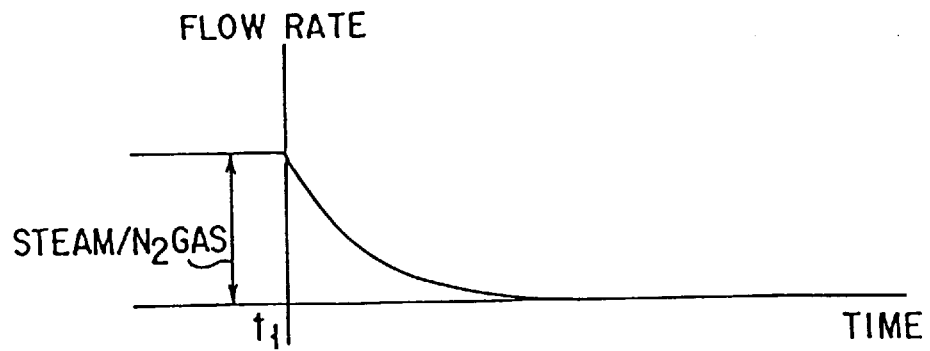
FIGS. 5A and 5B show graphs each covering the change with time in the gas flow rate into a process chamber in a method of manufacturing a semiconductor device according to the embodiment of the present invention.
Figure 5B:
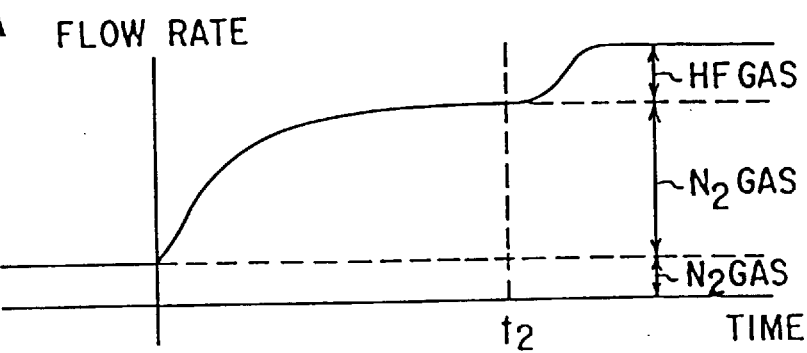

An etching treatment was applied to a 6-inch silicon wafer to remove a silicon oxide film, 100 nm thick, formed on the surface of the wafer by using the apparatus shown in FIG. 1. In this experiment, the gas flow rates were changed with time as shown in FIGS. 5A and 5B.

In the first step, the valve 8 was opened, with the mass flow controller 13 kept closed, so as to introduce 800 SCCM of a mixed gas consisting of steam and a nitrogen gas ($N_2$ gas) into the processing vessel 1. Then, the valve 7 was opened, with the mass flow controller 11 kept closed so as to introduce 700 SCCM of a nitrogen gas into the processing vessel 2. The valve 8 was closed 5 minutes later. At the same time, a nitrogen gas was introduced into the processing vessel by controlling the mass flow controller 10 so as to prevent the inner pressure of the processing vessel 2 from being fluctuated. Five seconds after the closing of the valve 8, 1000 SCCM of a hydrogen fluoride gas was introduced into the processing vessel 2 by controlling the mass flow controller 11 so as to carry out an etching treatment of the silicon oxide film. During the etching treatment, the pressure within the processing vessel 1 was set at $8.9 \times 10^3$ Pa, and the temperature within the processing vessel was maintained at 27° C.

The etching rates of the oxide film on various points of the silicon wafer were measured, with the result as shown in FIG. 7. The vertical and lateral positions indicated in FIG. 7 are on the basis that the orientation flat of the silicon wafer faces downward. The nonuniformity in the thickness over the entire surface of a single oxide film was ±1.27% before the etching treatment. On the other hand, the nonuniformity of the etching over the entire surface of the single wafer was found to be ±1.33%, which was only slightly larger than the value before the etching treatment.

On the other hand, a conventional etching treatment was applied to a 6-inch silicon wafer so as to remove a silicon oxide film, 100 nm thick, formed on the surface of the silicon wafer. To be more specific, a mixed gas consisting of 800 SCCM of steam and 700 SCCM of a nitrogen gas was introduced into a processing vessel. Supply of the mixed gas was stopped 5 minutes later, followed by introducing into the processing vessel for 5 minutes a mixed gas consisting of 100 SCCM of anhydrous HF gas, 800 SCCM of steam and 700 SCCM of a nitrogen gas so as to apply an etching treatment to the silicon oxide film. During the etching treatment, the pressure within the processing vessel was set at $8.9 \times 10^3$ Pa, and the temperature within the processing vessel was maintained at 27° C.

Figure 8:
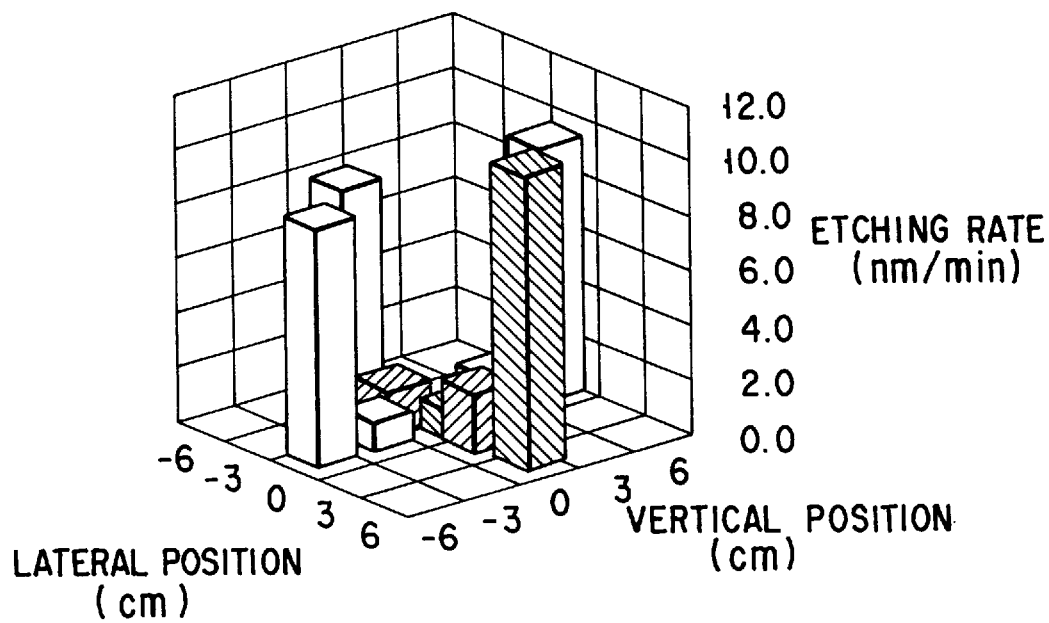
FIG. 8 schematically shows the nonuniformity of etching over the entire surface of a substrate, which accompanies the conventional method.

The etching rates of the oxide film on various points of the silicon wafer were measured, with the result as shown in FIG. 8. The nonuniformity in the thickness over the entire surface of a single oxide film was ±1.37% before the etching treatment. On the other hand, the nonuniformity of the etching over the entire surface of the single wafer after the etching treatment for 5 minutes was found to be as much as +35.21%.

As apparent from comparison between FIGS. 7 and 8, the uniformity of the etching rate was satisfactory in the case of using a process gas which did not contain steam as specified in the present invention. However, in the case of using a process gas containing steam as in the conventional technique, the etching rate in the peripheral portion of the wafer was found to be markedly higher than in the central portion, supporting a poor uniformity of the etching rate.

Steam was used in the Example described above. However, alcohol can be used in place of steam in the present invention, with substantially the same effect.

As described above, a gas containing steam is introduced in advance into the processing vessel in the present invention, followed by using a process gas which does not contain steam in carrying out an etching treatment of an oxide film. The particular technique of the present invention makes it possible to remove selectively by etching a very thin natural oxide film alone, which is formed on a semiconductor substrate, with a high etching uniformity.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising the step of etching an oxide film formed on a semiconductor substrate, wherein the etching step comprises:

introducing a first gas containing steam or alcohol into a processing vessel without introducing a hydrogen fluoride gas, said processing vessel housing said semiconductor substrate having the oxide film thereon;

stopping introduction of said first gas into the processing vessel;

removing said steam or alcohol remaining inside said processing vessel in the form of a gas; and introducing a hydrogen fluoride gas as a second gas into said processing vessel thereby removing at least part of said oxide film.

2. The method of manufacturing a semiconductor device according to claim 1, wherein an inert gas is simultaneously introduced into said processing vessel in the step of introducing said hydrogen fluoride gas into the processing vessel.

3. The method of manufacturing a semiconductor device according to claim 2, wherein the mixed gas comprising said hydrogen fluoride gas and said inert gas contains 5 to 10% by volume of hydrogen fluoride.

4. The method of manufacturing a semiconductor device according to claim 2, wherein said inert gas includes a nitrogen gas.

5. The method of manufacturing a semiconductor device according to claim 1, wherein said hydrogen fluoride gas does not contain steam or alcohol.

6. The method of manufacturing a semiconductor device according to claim 1, wherein said hydrogen fluoride gas is anhydrous hydrogen fluoride gas.

7. The method of manufacturing a semiconductor device according to claim 1, wherein said first gas containing steam or alcohol is introduced into the processing vessel through a first piping, said second gas of hydrogen fluoride gas is introduced into the processing vessel through a second piping, and an inert gas is kept introduced into the processing vessel through said first and second pipings.

8. The method of manufacturing a semiconductor device according to claim 1, wherein said first gas containing steam or alcohol is introduced into the processing vessel through a first piping, said second gas of hydrogen fluoride gas is introduced into the processing vessel through a second piping, an inert gas is kept introduced into the processing vessel through said second piping and, after stopping of the first gas introduction into the processing vessel, the flow rate of the inert gas introduced into the processing vessel through the second piping is increased.

9. The method of manufacturing a semiconductor device according to claim 1, wherein introduction of the hydrogen fluoride gas into the processing vessel is continued until water or alcohol attached to or absorbed by said semiconductor substrate is completely consumed.

10. The method of manufacturing a semiconductor device according to claim 1, wherein said etching step is performed repeatedly.

11. The method of manufacturing a semiconductor device according to claim 1, wherein said first gas includes a mixed gas containing steam or alcohol in an inert gas.

12. The method of manufacturing a semiconductor device according to claim 11, wherein said mixed gas contains 5 to 20% by volume of steam or 5 to 25% by volume of alcohol.

13. The method of manufacturing a semiconductor device according to claim 11, wherein said inert gas includes a nitrogen gas.

14. The method of manufacturing a semiconductor device according to claim 1, wherein said introducing a hydrogen fluoride gas step includes stopping said removal of the steam or alcohol remaining inside the processing vessel in the form of a gas before water or alcohol attached to or absorbed by said semiconductor substrate is completely removed.

15. The method of manufacturing a semiconductor device according to claim 1, wherein said oxide film is a natural oxide film.

* * * * *